US010825529B2

(12) United States Patent
Hsu et al.

(10) Patent No.: US 10,825,529 B2
(45) Date of Patent: Nov. 3, 2020

(54) LOW LATENCY MEMORY ERASE SUSPEND OPERATION

(71) Applicant: MACRONIX INTERNATIONAL CO., LTD., Hsinchu (TW)

(72) Inventors: Wen-Ming Hsu, Hsinchu (TW); Nai-Ping Kuo, Hsinchu (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 465 days.

(21) Appl. No.: 14/455,749

(22) Filed: Aug. 8, 2014

(65) Prior Publication Data
US 2016/0042796 A1 Feb. 11, 2016

(51) Int. Cl.
*G11C 16/34* (2006.01)
*G11C 16/16* (2006.01)

(52) U.S. Cl.
CPC .......... *G11C 16/16* (2013.01); *G11C 16/3409* (2013.01); *G11C 16/3445* (2013.01)

(58) Field of Classification Search
CPC .. G11C 16/16; G11C 16/3409; G11C 16/3445
USPC .................................................... 365/185.11
See application file for complete search history.

(56) References Cited

U.S. PATENT DOCUMENTS

| 5,229,632 | A | | 7/1993 | Yoshikawa | |
| 5,341,330 | A | | 8/1994 | Wells et al. | |
| 5,568,419 | A | * | 10/1996 | Atsumi | G11C 16/16 365/185.22 |
| 5,587,947 | A | * | 12/1996 | Chang | G11C 16/0416 257/E27.103 |
| 5,680,350 | A | * | 10/1997 | Lee | G11C 16/16 365/185.24 |
| 5,699,298 | A | | 12/1997 | Shiau et al. | |
| 5,790,456 | A | | 8/1998 | Haddad | |
| 5,805,501 | A | | 9/1998 | Shiau et al. | |
| 5,822,252 | A | * | 10/1998 | Lee | H01L 27/115 257/E27.103 |
| 6,055,190 | A | | 4/2000 | Lu et al. | |
| 6,252,803 | B1 | | 6/2001 | Fastow et al. | |
| 6,483,752 | B2 | | 11/2002 | Hirano | |
| 6,493,266 | B1 | | 12/2002 | Yachareni et al. | |

(Continued)

FOREIGN PATENT DOCUMENTS

| CN | 101430935 A | 5/2009 |
| WO | 9744792 A1 | 11/1997 |
| WO | 02067268 A1 | 8/2002 |

*Primary Examiner* — Mushfique Siddique
(74) *Attorney, Agent, or Firm* — Haynes Beffel & Wolfeld LLP

(57) ABSTRACT

A method for an erase operation on a nonvolatile memory array with low-latency erase suspend is described. The nonvolatile memory array includes a plurality of blocks of memory cells, each block including a plurality of sectors of memory cells. The method includes, in response to an erase command identifying a block in the plurality of blocks in the array, erasing the plurality of sectors in the identified block, and determining whether there are over-erased cells in each sector. The method includes recording the over-erased cells for the sector. The method also includes responsive to suspend before a soft program pulse for the sector, applying a correction pulse to the recorded cells.

2 Claims, 7 Drawing Sheets

(56) References Cited

U.S. PATENT DOCUMENTS

| | | | |
|---|---|---|---|
| 6,628,545 B1 * | 9/2003 | Li | G11C 16/3404 365/185.05 |
| 6,654,287 B2 | 11/2003 | Visconti | |
| 6,714,457 B1 | 3/2004 | Hsu et al. | |
| 6,735,125 B2 | 5/2004 | Hirano | |
| 6,834,012 B1 | 12/2004 | He et al. | |
| 7,009,881 B2 | 3/2006 | Noguchi | |
| 7,180,779 B2 | 2/2007 | Telecco et al. | |
| 7,180,781 B2 | 2/2007 | Abedifard et al. | |
| 7,266,019 B2 | 9/2007 | Taoka et al. | |
| 7,339,828 B2 | 3/2008 | Hasegawa et al. | |
| 7,463,525 B2 | 12/2008 | Zheng et al. | |
| 7,489,560 B2 | 2/2009 | Chang et al. | |
| 7,630,253 B2 | 12/2009 | Melik-Martirosian et al. | |
| 7,633,811 B2 | 12/2009 | Fang et al. | |
| 7,649,782 B2 | 1/2010 | Eguchi et al. | |
| 7,697,341 B2 | 4/2010 | Cha et al. | |
| 8,027,196 B1 | 9/2011 | Wong | |
| 8,130,550 B1 * | 3/2012 | Confalonieri | G11C 16/16 365/185.11 |
| 8,482,987 B2 | 7/2013 | Yu et al. | |
| 8,717,813 B2 | 5/2014 | Kuo et al. | |
| 2005/0099857 A1 | 5/2005 | Yuan et al. | |
| 2007/0140015 A1 | 6/2007 | Kawamura | |
| 2007/0242519 A1 | 10/2007 | Ito et al. | |
| 2008/0144389 A1 | 6/2008 | Chen et al. | |
| 2009/0290423 A1 | 11/2009 | Kim et al. | |
| 2010/0128525 A1 | 5/2010 | Mokhlesi | |
| 2010/0172188 A1 | 7/2010 | Chen et al. | |
| 2011/0273936 A1 | 11/2011 | Yu et al. | |
| 2012/0057410 A1 * | 3/2012 | Yu et al. | 365/185.29 |
| 2012/0201082 A1 | 8/2012 | Choy et al. | |
| 2012/0262988 A1 | 10/2012 | Kuo et al. | |

* cited by examiner

LOW LATENCY MEMORY ERASE SUSPEND OPERATION

TECHNICAL FIELD

This disclosure relates to nonvolatile memory.

DESCRIPTION OF RELATED ART

Flash memory is a class of nonvolatile integrated circuit memory technology. A memory cell of a flash memory device includes a charge storage structure such as a floating gate or a dielectric charge trapping layer. Data is stored in a memory cell of a flash memory device by controlling the amount of charge stored in the charge storage structure. The amount of stored charge sets a threshold voltage for the memory cell in the flash memory device that is associated with a value of the stored data.

Data can be programmed into a flash memory cell by applying program voltage pulses to the flash memory cell, causing charge to be stored in the charge storage structure of the cell. Data can be erased from a flash memory cell by applying erase voltage pulses to the flash memory cell, causing charge to be removed from the charge storage structure of the cell.

Sometimes after subjecting a flash memory cell to erase voltage pulses, the flash memory cell can be over-erased with its threshold voltage value being too low or even negative. Because of the excessively low threshold voltage value, the over-erased memory cell can be conductive even when it is not selected for a read operation. Read operations on other memory cells sharing the same bit line with the over-erased memory cell can fail due to leakage current caused by the conductive over-erased memory cell.

A flash memory device can be partitioned into erasable blocks. An erase operation on an erasable block applies erase voltage pulses to memory cells in the erasable block and verifies that data in all memory cells in the erasable block have been erased. As part of the erase operation, a soft program sequence is performed on the erasable block after the erase and erase verify sequence by applying program voltage pulses to correct over-erased memory cells in the erasable block.

A flash memory device can support an erase suspend command. The erase suspend command causes the flash memory device to suspend an erase operation on an erasable block and allow another operation such as a read operation to proceed. Before suspending the erase operation, a soft program sequence could be performed on the erasable block to correct over-erased memory cells in the erasable block. However, the typical operation time for the soft program sequence is about one to a few milliseconds, which is much longer than the latency requirement (of about 10 microseconds) for the erase suspend command.

For an erasable block undergoing an erase operation interrupted by an erase suspend command, a negative voltage can be applied to the erasable block to reduce leakage from over-erased memory cells in the erasable block, as describe in U.S. Pat. No. 8,482,987, titled Method and Apparatus for the Erase Suspend Operation. The method for applying a negative voltage to reduce leakage from over-erased memory cells described in U.S. Pat. No. 8,482,987 can have shorter latency time in response to an erase suspend command than using a soft program sequence to correct over-erased memory cells. However, the method for applying a negative voltage to reduce leakage from over-erased memory cells requires negative voltage pump circuits that can increase die area and cost.

It is therefore desirable to provide for a low-latency method for reducing leakage from over-erased memory cells in an erasable block undergoing an erase operation interrupted by an erase suspend command. It is also desirable that the implementation of the low-latency method does not significantly increase die size and cost.

SUMMARY

The present technology provides a circuit comprising a nonvolatile memory array comprising a plurality of blocks of memory cells, each block comprising a plurality of sectors of memory cells; and control logic, the control logic configured to respond to an erase command identifying a block in the plurality of blocks in the array, to erase the plurality of sectors of the identified block, and to determine whether there are over-erased cells in each sector.

Also described is a circuit comprising a nonvolatile memory array; and control logic, the control logic being configured to:

(1) respond to an erase command identifying a block of memory cells in the array, by executing an erase operation including an erase sequence applying an erase bias that tends to reduce threshold voltages of memory cells in the block, and an erase verify sequence that determines whether the memory cells in the block have threshold voltages below a first erase verify level, and that identifies a memory cell in the block that has a threshold voltage below a second erase verify level, different from the first erase verify level; and (2) respond to an erase suspend command by executing an erase suspend operation suspending the erase operation, including applying a bias arrangement to the identified cell tending to increase the threshold voltage of the identified memory cell, and allowing the control logic to execute another operation on the memory array.

A method is also described for an erase operation on a nonvolatile memory array with low-latency erase suspend is described. The nonvolatile memory array comprises a plurality of blocks of memory cells, each block comprising a plurality of sectors of memory cells. The method includes, in response to an erase command identifying a block in the plurality of blocks in the array, erasing the plurality of sectors in the identified block, and determining whether there are over-erased cells in each sector. The method includes recording the over-erased cells for the sector. The method also includes responsive to suspend before a soft program pulse for the sector, applying a correction pulse to the recorded cells.

Other aspects and advantages of the present technology can be seen on review of the drawings, the detailed description and the claims, which follow.

DETAILED DESCRIPTION

A detailed description of embodiments of the present technology is provided with reference to the Figures.

Figure 1:
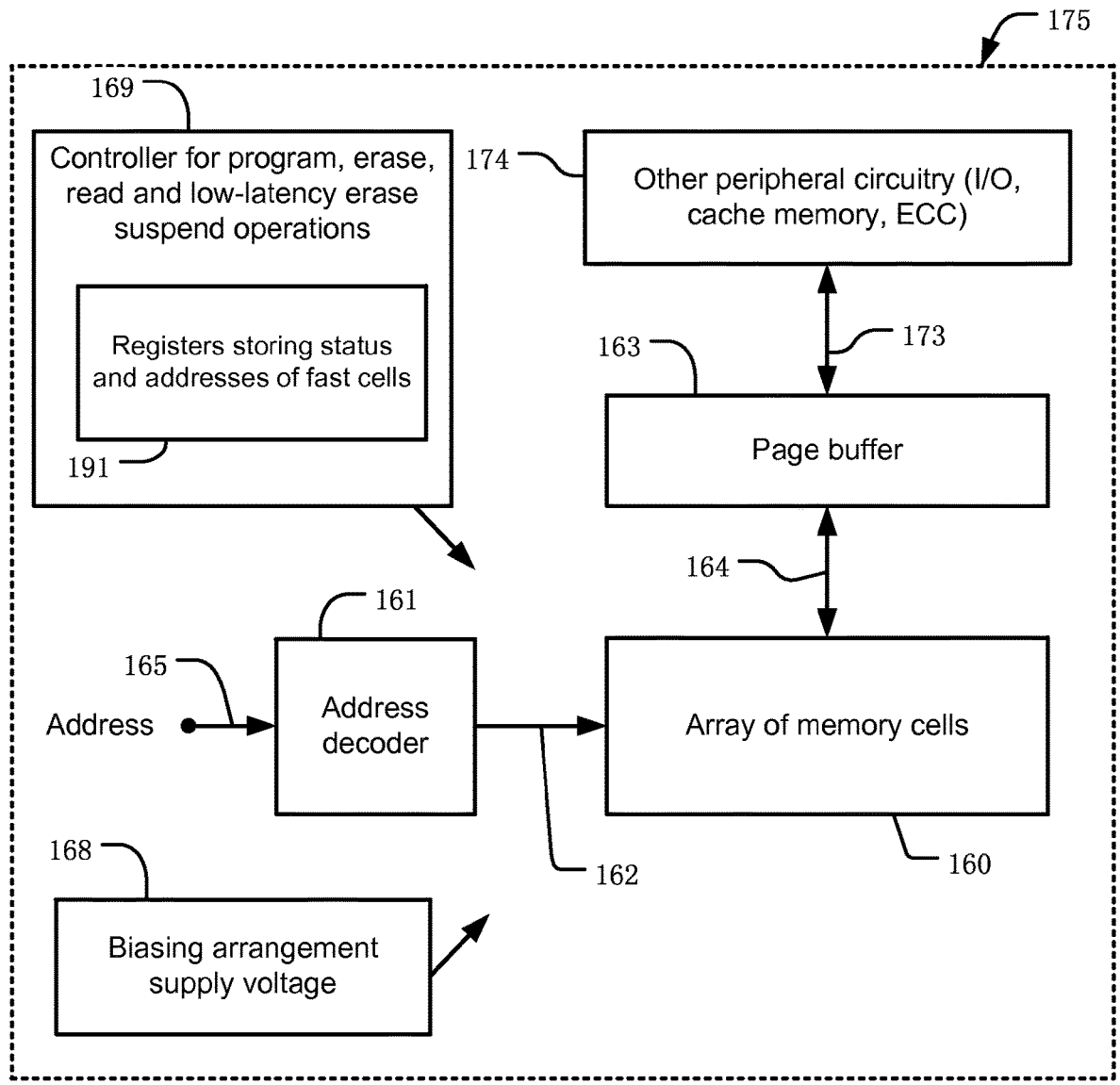
FIG. 1 is a simplified block diagram of a memory.

FIG. 1 is a simplified block diagram of an example memory 175. The memory 175 includes an array 160 of memory cells. The array 160 can include NOR flash memory cells, NAND flash memory cells, or other suitable charge storage nonvolatile memory cells.

An address decoder 161 is coupled to the array 160 via lines 162. Addresses are supplied on bus 165 to the address decoder 161. The address decoder 161 can include word line decoders, bit line decoders, and other suitable decoders that decode the supplied addresses and select corresponding memory cells in the array 160.

Bit lines in the array 160 are coupled via lines 164 to a page buffer 163, which in turn are coupled to other peripheral circuitry 174 via lines 173.

Peripheral circuitry includes circuits that are formed using logic circuits or analog circuits that are not part of the array 160, such as the address decoder 161, controller 169, biasing arrangement supply voltage block 168, and so on. In this example, the block 174 labeled other peripheral circuitry can include input-output (I/O) circuits, cache memory, error-code-correction (ECC) circuits, and other circuit components on the memory 175, such as a general purpose processor or special-purpose application circuitry, or a combination of modules providing system-on-a-chip functionality supported by the array 160. Data is supplied via the lines 173 to I/O ports or to other data destinations internal or external to the memory 175. Data to and from the array 160 can be stored (cached) in the cache memory. The ECC circuit can perform ECC functions (e.g., parity check) on the cached data to ensure integrity of the data to and from the array 160.

The controller 169, implemented for example as a state machine, provides signals to control the application of bias arrangement supply voltage generated or provided through the voltage supply, or supplied in block 168, to carry out the various operations described herein. These operations include erase operations, read operations, and program operations. These operations also include low-latency erase suspend operations described herein. The controller is coupled to the address decoder 161, the page buffers 163, and the other peripheral circuitry 174. The controller can be implemented using special-purpose logic circuitry as known in the art. In other embodiments, the controller comprises a general-purpose processor, which may be implemented on the same memory 175, which executes a computer program to control the operations of the device. In yet other embodiments, a combination of special-purpose logic circuitry and a general-purpose processor may be utilized for implementation of the controller.

The page buffer 163 is coupled to bit lines of the array 160, and can include one or more storage elements (e.g., latches) for each bit line connected. The controller 169 can cause the address decoder 161 to select and couple specific memory cells in the array 160 via respective connecting bit lines to the page buffer 163, and cause the page buffer 163 to store data that is written to or read from these specific memory cells.

Figure 2:
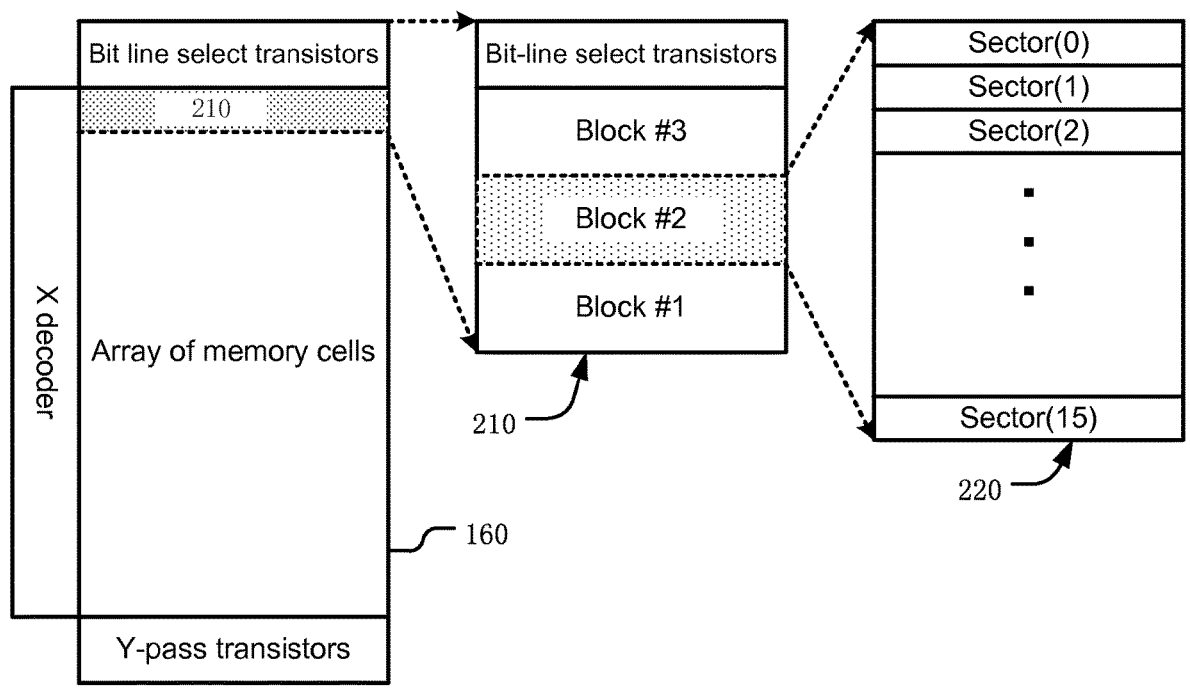
FIG. 2 illustrates a partition of a memory array of memory cells.

FIG. 2 illustrates a partition of the memory array 160 of memory cells illustrated in FIG. 1. In the example of FIG. 2, X decoder (e.g., as part of address decoder 161) decodes supplied addresses and selects corresponding word lines in the array 160. The array 160 includes one or more P-type (or N-type) wells. Bit line select transistors (e.g., based on addresses decoded by a bit line decoder) select memory cells belonging to the same well and connect these cells to global bit lines and via Y-pass transistors to sense amplifiers. Memory cells belonging to the same well (e.g., as illustrated by area 210 in FIG. 2) can be partitioned into a plurality of blocks of memory cells. Each block corresponds to an erase command issued by a host system incorporating the memory 175. A file system or software module of a host system incorporating the memory 175 can issue an erase command to the memory 175 with an erase instruction code and an identification of a particular block (e.g., by providing an address of the particular block).

Figure 3:
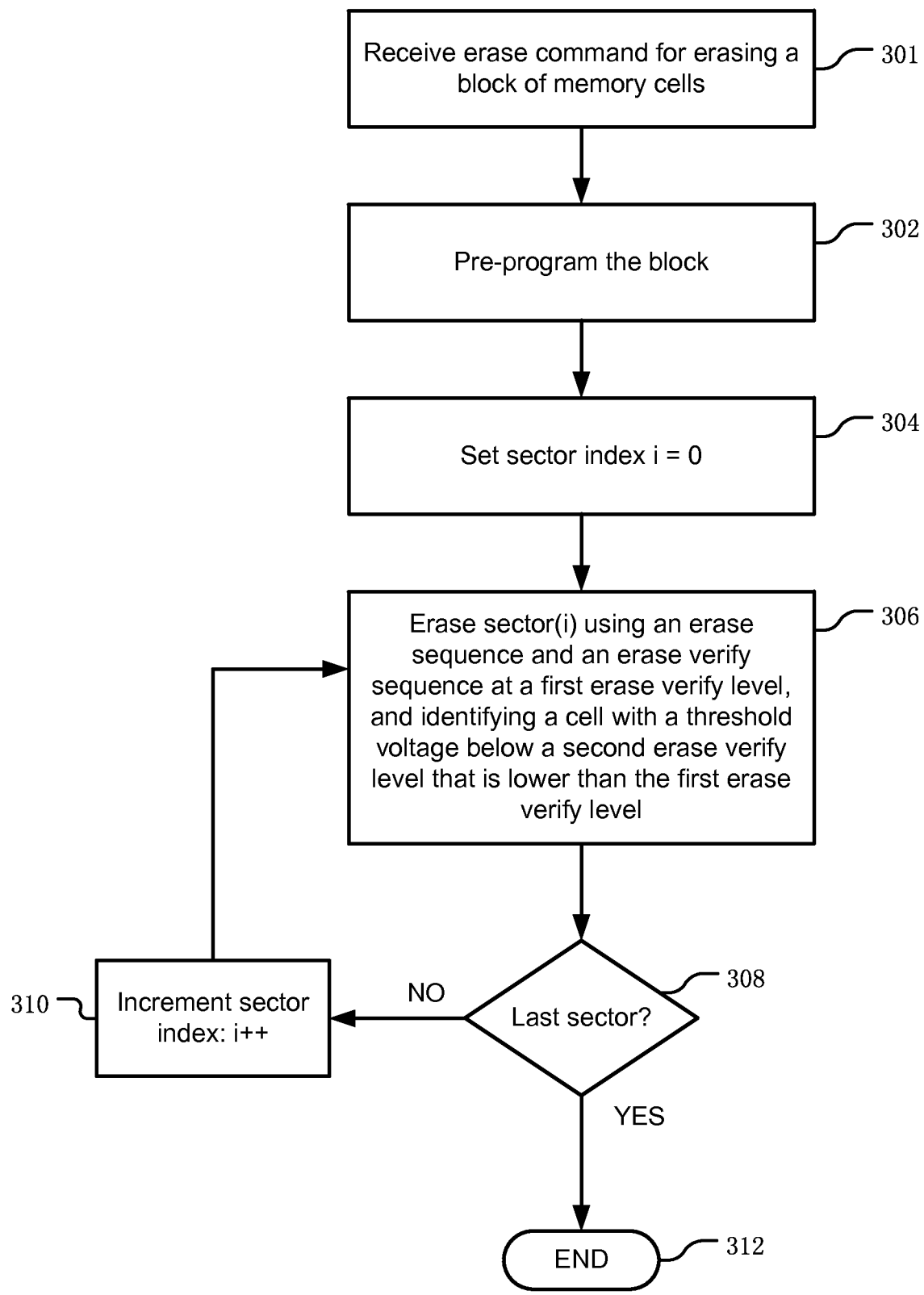
FIG. 3 is a flow chart of a method for erasing a block of memory cells.

Instead of a single threshold voltage value, a group of memory cells can have a range or distribution of threshold voltages because each memory cell has different transistor characteristics and experiences a different environment (e.g., different electric fields). The width of a threshold voltage distribution of memory cells in a block of memory cells (corresponding to a target of an erase command) can be reduced by partitioning the block into multiple sectors of memory cells. For example, each block (e.g., Block #2) in FIG. 2 is partitioned into 16 sectors (220). Each sector can be accessed by one or more word lines of the memory array 160. For example, each sector can be accessed by a global word line of the array 160. The global word line includes 8 local word lines connected to 4,096 memory cells. Each sector has a cell threshold voltage distribution that is narrower than the cell threshold voltage distribution of the entire block (including 16 erase sectors). The erase command for the block can be carried out by applying erase and erase verify sequences to each of the sectors of the block, as illustrated in FIG. 3 below. Since a sector has a narrower cell threshold voltage distribution than a block, it could require fewer erase pulses to move the cell threshold voltage distribution of the sector from being above a high threshold value (corresponding to a programmed state) to being below a low threshold value (corresponding to an erased state).

FIG. 3 is a flow chart of a method for erasing a block of memory cells illustrated in FIG. 2. FIG. 3 shows an example of a block erase operation which iteratively erase the block sector by sector, with erase, erase verify and soft program steps for each sector. The example of FIG. 3 includes, in response to an erase command identifying a block of memory cells, executing an erase operation on each of the sectors of the block. The erase operation of each sector includes executing an erase sequence including applying an erase bias that tends to reduce threshold voltage of memory cells in the sector. The erase operation of the sector also includes executing an erase verify sequence. The erase verify sequence includes determining whether the memory cells in the sector have threshold voltage below a first erase verify level. The erase verify sequence also includes identifying a memory cell in the sector that has a threshold voltage below a second verify level that is different from the first verify level. The erase operation of the sector also includes applying a soft program sequence after the erase verify sequence.

The method of FIG. 3 can be implemented by the controller 169, the biasing arrangement supply voltage block 168, and other components of the memory 175. In this example, the method for erasing a block of memory cells starts at Step 301. At Step 301, the memory 175 receives an erase command for erasing a block of memory cells. For example, the memory 175 can receive an erase command from a host system incorporating the memory 175. The erase command can include an erase instruction code and an address of the block of memory cells to be erased.

In response to the erase command, the controller 169 executes an erase operation on the block of memory cells. As part of the erase operation, the controller 169 first executes a pre-program sequence on the block (Step 302). The pre-program sequence programs memory cells in the erase unit to approximately the same threshold voltage range, so that the subsequent erase and erase verify sequences are applied to memory cells having similar threshold voltages.

As part of the erase operation on the block of memory cells, the controller 169 executes an erase sequence and an erase verify sequence on the block. The controller 169 starts executing an erase sequence and an erase verify sequence in this example by setting a sector index identifying a first erase sector (e.g., Sector(0) illustrated in FIG. 2) of the erase unit (Step 304). Then the sector identified by the index is erased using an erase sequence and an erase verify sequence (Step 306). As will be discussed in more detail with FIGS. 4 and 5 below, the erase sequence applies a sequence of voltage pulses that reduce threshold voltage of the memory cells in the sector. The erase verify sequence determines whether the memory cells in the sector have threshold voltages below a first erase verify level. The erase verify sequence also identifies a memory cell in the sector that has a threshold voltage below a second erase verify level. Here, the second erase verify level is lower than the first erase verify level. After the sector is erased, the index is checked to determine whether the last sector in the erase unit has been erased (Step 308). If not, then the index is incremented (Step 310), and the process returns to step 306. In this way, the erase sequence and erase verify sequence are executed on all erase sectors in the unit, until memory cells in the last erase sector (e.g., Sector(15) illustrated in FIG. 2) are erased, and the process ends (Step 312).

Figure 4:
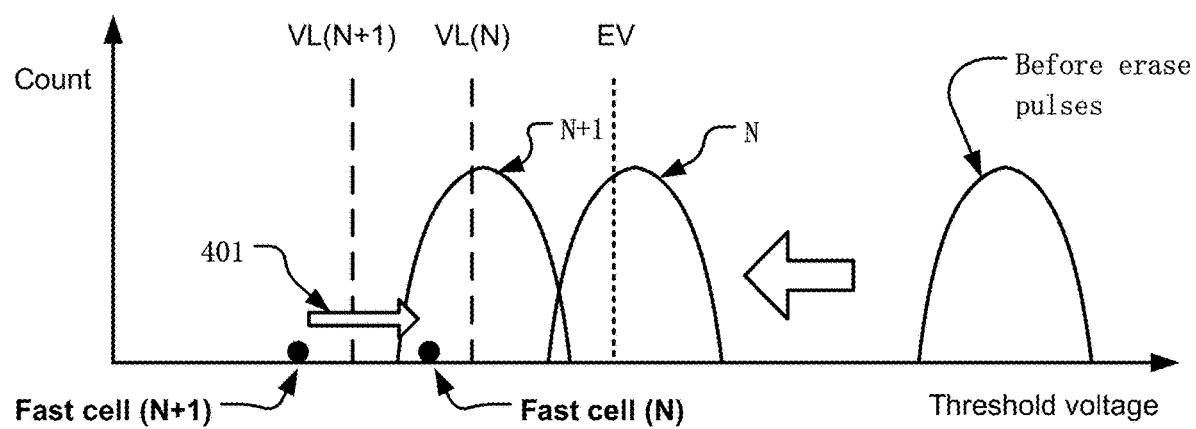
FIG. 4 illustrates an example distribution of threshold voltages of memory cells in a sector of memory cells.

FIG. 4 illustrates an example distribution of threshold voltages of memory cells in a sector of memory cells. Each erase voltage pulse applied to memory cells in the sector (at Step 306 of FIG. 3) decreases threshold voltages of the memory cells in the sector. FIG. 4 shows the cell threshold voltage distribution of the memory cells in the sector before erase pulses, after N erase pulses, and after (N+1) erase pulses. The successive erases pulses move the cell threshold voltage distribution towards the left, as indicated by the arrow in FIG. 4.

The goal of erasing a sector of memory cells is to move the cell threshold voltage distribution from being above a level corresponding to the programmed state to being below a level corresponding to the erased state. More particularly, the goal of erasing the sector of memory cells is to move the threshold voltage distribution to being below a first erase verify level EV illustrated in FIG. 4. After each erase pulse is applied to the sector, threshold voltages of the memory cells in the sector are verified against the first erase verify level EV. As illustrated in FIG. 4, all memory cells in the sector are determined as erased after (N+1) erase pulses since the entire threshold voltage distribution is positioned to the left of the first erase verify level EV after (N+1) erase pulses.

In addition, after each erase pulse is applied to the sector, threshold voltages of the memory cells in the sector are verified against a second erase verify level VL. Note that the second erase verify level VL is lower than the first erase verify level EV, for at least the last erase pulse in the sequence. The second erase verify level VL is used to identify memory cells in the sector with threshold voltages that are lower than an expected threshold for cells after a particular erase pulse in an erase sequence, and for the at least some cycles that expected threshold is below the first verify level EV (i.e., already erased). The memory cells identified by the second erase verify level VL, or so-called fast cells, are more likely to require a soft program pulse to increase the threshold voltage as indicated by arrow 401, to avoid the over erased condition. An identifier of the cell, such as an offset address, is stored in a register that is readable by the controller, at least for the duration of the sector erase process. For example, FIG. 4 shows the fast cell identified after the N erase pulses and the fast cell identified after the (N+1) erase pulses. As illustrated in FIG. 4, a fast cell has a threshold voltage that is an "outlier" relative to threshold voltages of the rest of the memory cells in the erase sector.

In the example of FIG. 4, different and decreasing values of the second verify level VL are used to identify fast cells after succeeding erase pulses in an erase sequence. For an illustrative example, the first erase verify level EV used with a first erase pulse in a sequence can be 4V. The second verify level VL can be 3.5V after the second erase pulse, 3V after the third erase pulse, and 2.5V after the fourth and subsequent erase pulses. In another example, a single value of the second erase value VL can be used to identify fast cells after each erase pulse. For example, the first erase verify level EV can be 5V, while the second erase verify level VL can be 1.3V for all erase pulses.

Figure 5:
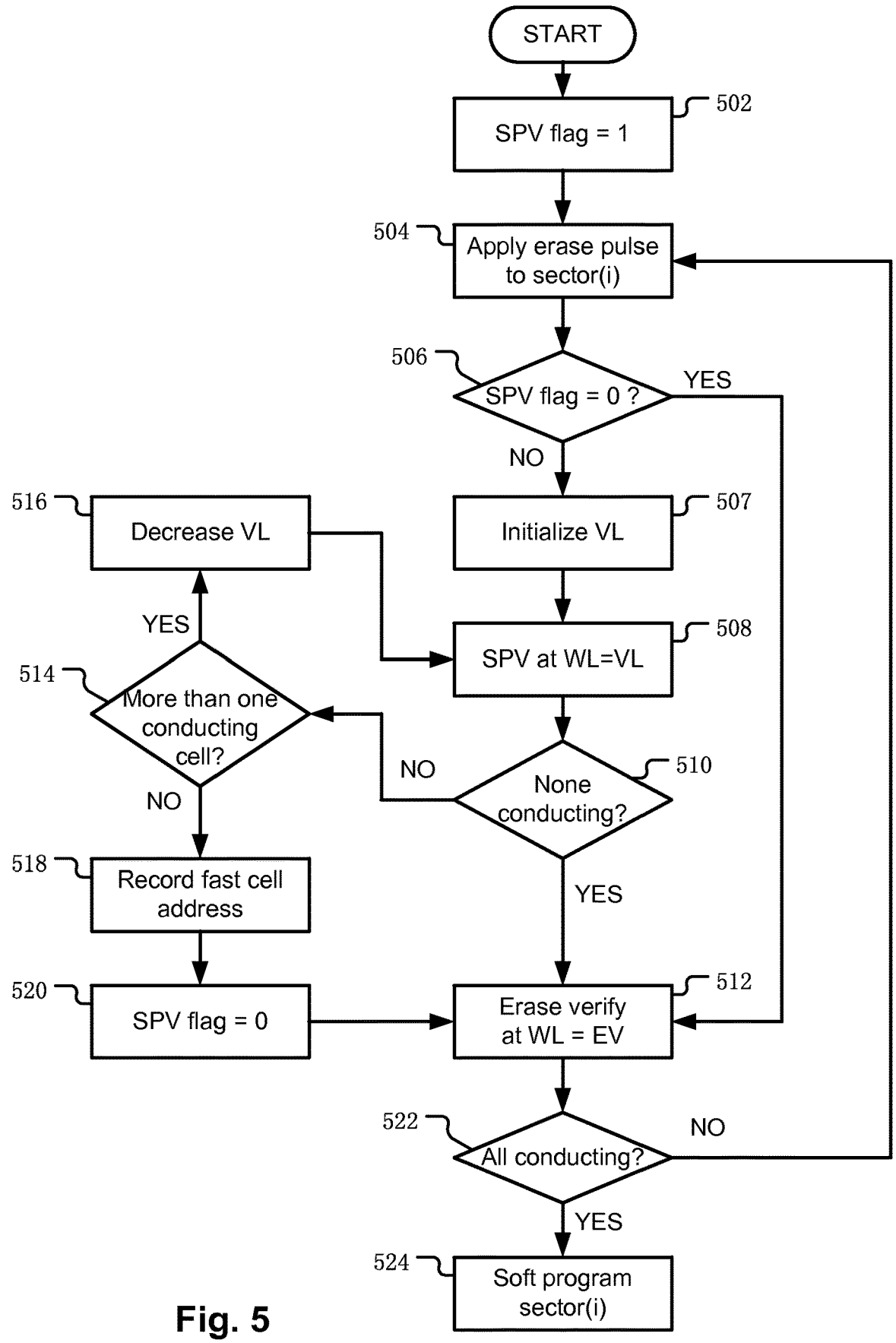
FIG. 5 is a flow chart for erasing a sector of memory cells.

FIG. 5 is a flow chart for one example of an erase sequence and an erase verify sequence for a sector of memory cells (Step 306 of FIG. 3). In this example, the flow chart starts at Step 502. At Step 502, the controller 169 initializes a flag, designated for the purposes of identification as an SPV (soft program verify) flag, to 1. The SPV flag can be stored in registers 191 of the memory 175 illustrated in FIG. 1.

The controller 169 executes an erase sequence and an erase verify sequence on the sector of memory cells. As part of the erase sequence, the controller 169 causes the biasing arrangement supply voltage block 168 to apply an erase pulse to memory cells in the sector (Step 504). The erase pulse decreases threshold voltages of the memory cells in the sector.

After the erase pulse is applied to the memory cells in the sector, the controller 169 executes the erase verify sequence on the sector. The controller 169 first determines whether the SPV flag is set to 0 (Step 506). If it has been set to 0 (such as when a fast cell or cells have already been identified in the current sector), then the controller 169 proceeds to Step 512 to verify that all the memory cells in the sector have been erased at a first erase verify level EV, as will be described later.

As part of the erase verify sequence, if the SPV flag is not set to 0 (i.e., the SPV flag is set to 1), then after the current erase pulse the controller 169 identifies fast cells in the erase sector that have threshold voltages below a second erase verify level VL. The controller 169 performs one or more soft program verify (SPV) steps which are configured to identify fast cells in the sector.

At Step 507, the controller 169 initializes the second erase verify level VL (e.g., VL=1.3V lower than the first erase verify level). As described with FIG. 4 earlier, the second erase verify level VL is lower than the first erase verify level EV (at Step 512). The controller 169 then executes a second verify step at the second erase verify level VL by applying a voltage bias of the second erase verify level VL to word lines of the sector (Step 508). A cell with a threshold voltage higher than the second erase verify level VL would not conduct. A cell with a threshold voltage lower than the second erase verify level VL would conduct.

At Step 510, the controller 169 determines whether there are any memory cells in the sector with a threshold voltage lower than the second erase verify level VL. If all memory cells in the erase sector have threshold voltages higher than the second erase verify level VL (i.e., none are conducting), the controller 169 then proceeds to Step 512 to verify that all the memory cells in the sector have been erased at the first erase verify level EV.

If any memory cells in the sector are found having threshold voltages lower than the second erase verify level VL (i.e., they are conducting under the word line voltage bias of the second erase verify level VL) at Step 510, the controller 169 then proceeds to identify one or more of these cells having threshold voltages lower than the second erase verify level VL. Instead of identifying all memory cells in the sector having threshold voltages lower than the second erase verify level VL, the controller 169 identifies a subset (e.g., one, two, or five) of memory cells (fast cells) having threshold voltages lower than the second erase verify level VL. The number of cells identified is a design tradeoff based because it is easier to manage and record one or a few fast cells at a time without significantly increasing die area and cost.

In the example of FIG. 5, one fast cell is identified, and its identifier is recorded by storage in a register for example. After determining at Step 510 that there are one or more cells in the sector having threshold voltages lower than the second erase verify level VL, the controller 169 determines whether more than one of such memory cells have been detected at Step 514. If more than one memory cell having a threshold voltage lower than the second erase verify level VL is detected, the controller 169 decreases the second erase verify level VL (e.g., by 0.1V) at Step 516, and returns to step 508. The controller 169 can repeat the loop of Steps 516, 508, 510, and 514, until a single fast cell is identified. For example, the controller 169 can start the second verify step (Step 508) with the second erase verify level VL initialized at 1.3V (at Step 507), and decrease the second erase verify level VL at 0.1V steps, until a single fast cell is identified. The single identified fast cell has the lowest threshold voltage among all memory cells of the erase sector that have threshold voltages below the initial second erase verify level. Similarly, the controller 169 can record more than one fast cell in the sector by iterating a loop similar to the loop of Steps 508, 510, 514, and 516 until a register set is full, or until no more than, for an arbitrary example, five memory cells are identified and recorded. In one embodiment, the controller 169 records all memory cells in the erase sector that have threshold voltages lower than the initial second erase verify level VL. That is, the controller 169 skips the loop-back through Steps 514 and 516.

At Step 518, the controller 169 records the address or other identifier of the identified fast cell in the registers 191. At Step 520, the controller 169 sets the SPV flag to 0, indicating a fast cell in the erase sector has been identified, and is a candidate for soft program in the event of an erase suspend operation. Then, the controller 169 proceeds to Step 512.

At step 512, the controller 169 verifies all the memory cells in the erase sector have been erased at the first erase verify level EV. A voltage bias of the first erase verify level EV is applied (e.g., by the biasing arrangement supply voltage block 168) to word lines of the sector. A memory cell is determined as erased if its threshold voltage is lower than the first erase verify level EV and would conduct under the word line voltage bias for a read.

At Step 522, the controller 169 determines whether all the memory cells in the sector have been erased at the first erase verify level EV (e.g., 5V). If all memory cells in the erase sector have threshold voltage less than the first erase verify level EV and thus conduct under the word line voltage bias, the controller 169 determines that all memory cells in the erase sector are erased. The controller 169 then proceeds to the soft program step at Step 524. If not all the memory cells in the erase sector are verified as erased at the first erase verify level EV (i.e., some are not conducting under the word line voltage bias), the controller 169 repeats the erase and erase verify sequences, including identifying one or more fast cells, as indicated by the loop-back to Step 504, until all the memory cells in the erase sector are verified as erased at the first erase verify level EV.

After all memory cells in the sector are determined as erased at Step 522, the controller 169 proceeds to execute a soft program sequence to correct over-erased memory cells in the sector (Step 524). The soft program sequence can include identifying over-erased cells at a third erase verify level. The third erase verify level is lower than the first erase verify level EV. For example, the first erase verify level can be 5V, while the third erase verify level can be 3V. The soft program sequence also includes correcting the identified over-erased cells by applying a sequence of soft program voltage pulses (e.g., by the biasing arrangement supply voltage block 168) to the identified over-erased memory cells in the sector. The soft program voltage pulses increase the threshold voltage of the over-erased memory cells (thus making them less likely to be conducting or causing current leakage during normal read bias conditions applied to other memory cells).

Figure 6:
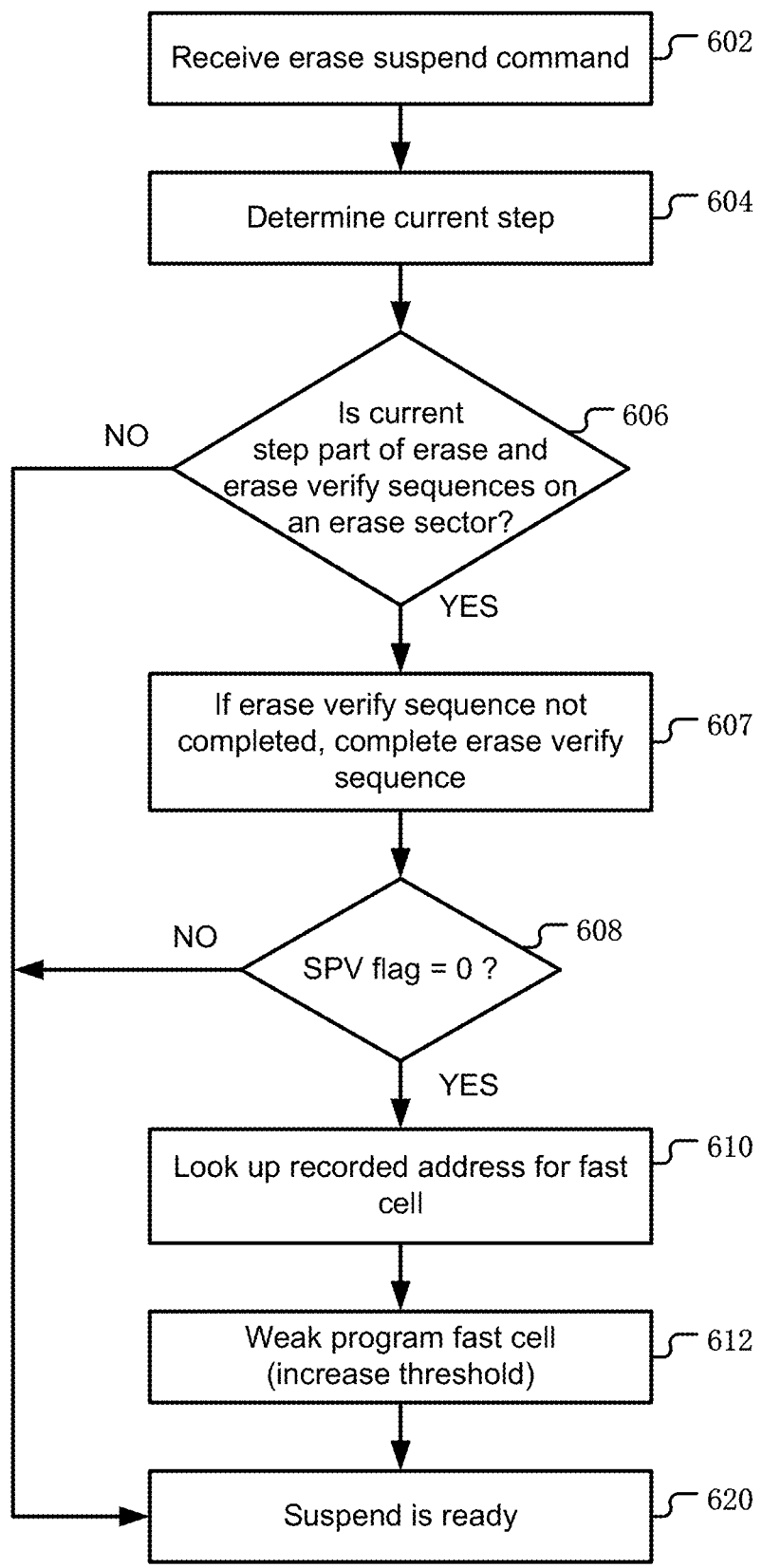
FIG. 6 is a flow chart of a method for a low-latency erase suspend operation.

FIG. 6 is a flow chart of a method for a low-latency erase suspend operation. The method of FIG. 6 can be implemented by the controller 169, the biasing arrangement supply voltage block 168, and other components of the memory 175. In this example, the method for a low-latency erase suspend operation starts at Step 602. At Step 602, the memory 175 receives an erase suspend command (e.g., from a host system incorporating the memory 175). The erase suspend command requests the memory 175 to suspend an erase operation on a block of memory cells in the memory array 160. The erase suspend command can allow the controller 169 (or other components of the memory 175) to execute a different operation on the memory array 160 such as a read operation, after safely stopping the erase operation.

In response to the erase suspend command, the controller 169 determines the current step of the erase operation on the block (Step 604). The controller 169 can safely stop execution of the erase operation on the block in a manner that depends on the current step. At Step 606, the controller 169 determines whether the current step is part of erase and erase verify sequences performed on a sector of the block (i.e., Step 306 of FIG. 3, or part of the flow chart of FIG. 5), which is the part of the erase operation at which the sector erase cycles are performed. Of course, other suspend logic can be applied in other portions of the erase operation. In this explanation, if the current step is not part of erase and erase verify sequences on a sector of the block, the controller 169 then proceeds to suspend the erase operation on the block at the current step (Step 620). For example, if the current step is before erasing a sector in the block (before Step 306 in FIG. 3), then there is no risk of over-erased cells or fast cells in the block since no erase pulses have been applied to memory cells in the block, and the controller 169 can safely suspend execution of the erase operation on the block.

If the current step is part of the erase and erase verify sequences on a sector of the block, the controller 169 completes the erase verify sequence on the sector, if the erase verify has not already been completed (Step 607). The erase verify can be executed only over the current sector, rather than the whole block.

At Step 608, the controller 169 determines whether the SPV flag had been set to 0, indicating that one or more fast cells had been identified in the sector that is currently being erased. If the SPV flag is 1, the controller 169 then can proceed to suspend the erase operation on the block (Step 620). If there are fast cells identified in the erase sector (i.e., SPV flag is set to 0), then the controller 169 accesses the registers 191 to look up the addresses for the identified fast cells (Step 610). At Step 612, the controller 169 executes a weak program sequence to correct the identified fast cells only. The weak program sequence includes applying one or more voltage pulses (e.g., by the biasing arrangement supply voltage block 168) to the identified fast cells. The voltage pulses of the weak program sequence increase the threshold voltages of the identified fast cells, such that the fast cells are less likely to be conducting (causing current leakage) during normal read bias conditions applied to other memory cells. After the weak program sequence completes, the controller 169 proceeds to suspend the erase operation on the block (Step 620). After the erase operation on the block is suspended at Step 620, the controller 169 (or other modules in the memory 175) can safely proceed with another operation on the memory 175.

Since the weak program operation (Step 612) takes only about several microseconds, the erase suspend operation illustrated by the method of FIG. 6 can satisfy the latency requirement (of about 10 microseconds) for the erase suspend command.

Before proceeding to suspend the erase operation on the block at Step 620, the controller 169 can store in the registers 191 a status indicator indicating the step in the erase operation on the block that is being suspended. For example, the status indicator can indicate the step before the erase operation suspension is the pre-program sequence (Step 302 of FIG. 3). The status indicator can indicate the sector that is being erased before the erase operation is suspended. The status indicator can also include the number of erase pulses that have been applied to the sector before the erase operation suspension. After the suspension completes, the controller 169 can resume the suspended erase operation at the step indicated by the status indicator.

Figure 7:
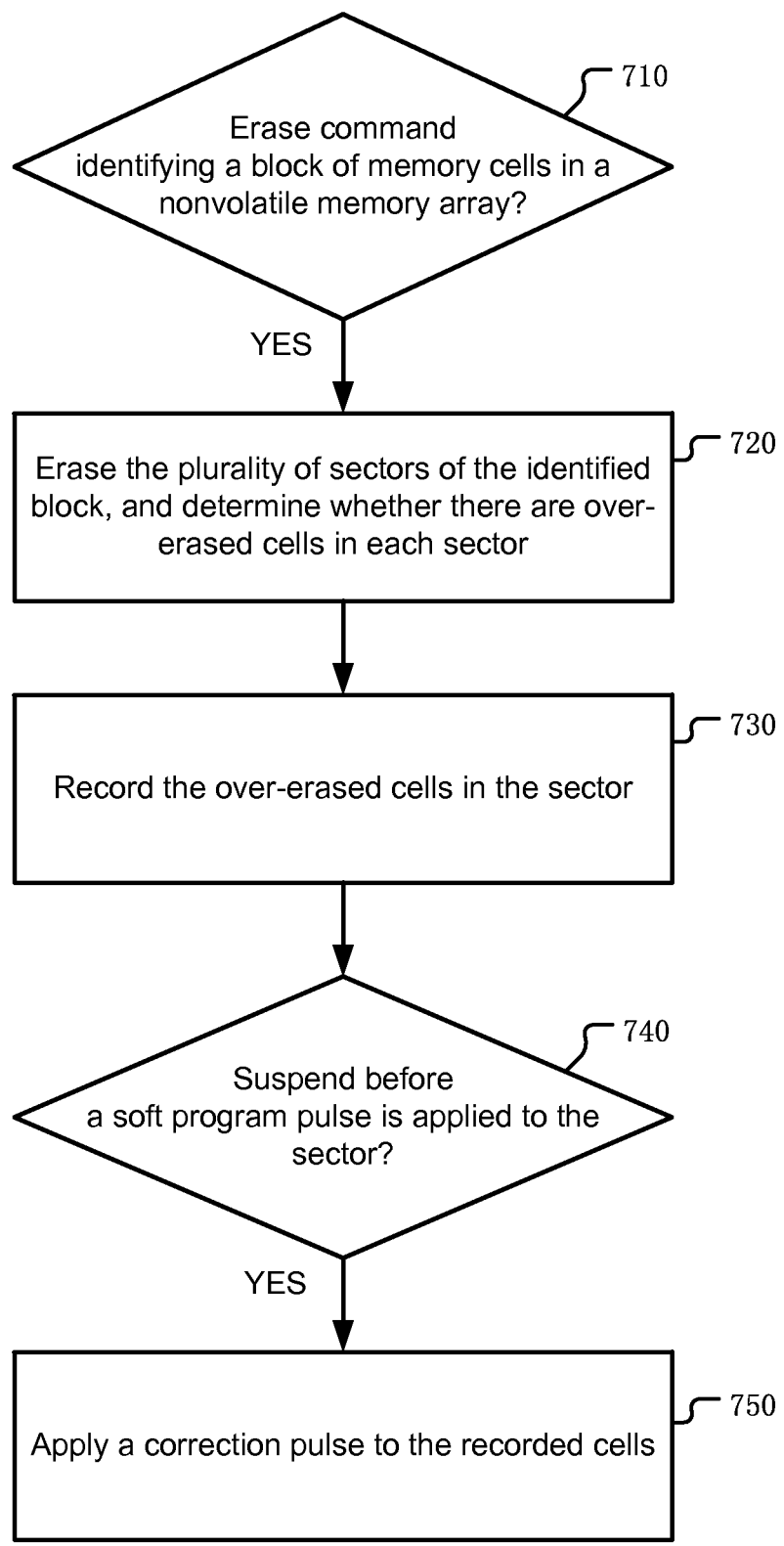
FIG. 7 is a flow chart of a method for erase and erase suspend operations.

FIG. 7 is a flow chart of a method for erase and erase suspend operations on a nonvolatile memory array, such as the array 160 of the memory 175 illustrated in FIGS. 1 and 2. The memory array comprises a plurality of blocks of memory cells. Each block can be identified by an erase command issued by a host system incorporating the memory 175. Each block comprises a plurality of sectors of memory cells. The method of FIG. 7 can be implemented by the controller 169, the biasing arrangement supply voltage block 168, and other components of the memory 175. In this example, the method for erase and erase suspend operations on a nonvolatile memory array starts at Step 710. At Step 710, the controller 169 determines whether the memory 175 receives (e.g., from a host system incorporating the memory 175) an erase command identifying a block in the plurality of blocks in the array 160, such as the block #2 illustrated in FIG. 2. If the memory 175 receives an erase command identifying a block in the plurality of blocks in the array 160, the controller 169 (with other components of the memory 175) erases the plurality of sectors in the identified block (e.g., Sector(0) to Sector(15) of the block #2 illustrated in FIG. 2). The controller 169 causes the address decoder 161 to select memory cells in each sector of the identified block and cause the biasing arrangement supply voltage 168 to apply an erase bias that tends to reduce threshold voltage of memory cells in the sector (e.g., as described above with FIG. 4).

The controller 169 also determines whether there are over-erased cells in each sector. As described above with FIG. 5, the controller 169 verifies whether memory cells in the sector have threshold voltage below the first erase verify level EV (e.g., Step 512 of FIG. 5). The controller 169 also determines whether there are over-erased cells in the sector that have threshold voltages below the second erase verify level VL (e.g., Steps 508 and 510 of FIG. 5). The second erase verify level VL is lower than the first erase verify level EV. At Step 730, the controller 169 records the over-erased cells in the sector. For example, the controller 169 can record a single over-erased cell in the sector (e.g., recording an address of a fast cell as described with Step 518 of FIG. 5).

The controller 169 can cause the biasing arrangement supply voltage 168 to apply a soft program pulse to the sector (e.g., Step 524 of FIG. 5) after determining whether there are over-erased cells in the sector. At Step 740, the controller 169 determines whether the memory 175 receives an erase suspend command before a soft program pulse is applied to the sector. If the memory 175 receives an erase suspend command before a soft program pulse is applied to the sector, at Step 750, the controller 169 causes the biasing arrangement supply voltage 168 to apply a correction pulse to the recorded cells. As described above with FIG. 6, the correction pulse tends to increase threshold voltages of the recorded cells (that are over-erased).

A method for forming a memory, comprises providing a nonvolatile memory array comprising a plurality of blocks of memory cells, each block comprising a plurality of sectors of memory cells; and providing control logic configured to respond to an erase command identifying a block in the plurality of blocks in the array, to erase the plurality of sectors of the identified block, and to determine whether there are over-erased cells in each sector.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A circuit comprising:
    a nonvolatile memory array comprising a plurality of blocks of memory cells, each block comprising a plurality of sectors of memory cells;
    peripheral circuitry coupled to word lines and bit lines in the array, including an address decoder, a page buffer, and biasing arrangement supply voltage sources; and
    control logic coupled to the peripheral circuitry, the control logic configured to respond to an erase command identifying a block of the plurality of the blocks by:
    executing an erase operation for the sectors in the plurality of sectors, the erase operation including for a current sector an erase and erase verify sequence followed by a soft program sequence, the erase and erase verify sequence configured to:

apply one or more erase pulses to the current sector, and identify one or more over-erased cells in the current sector, wherein, in response to an erase suspend command received during the erase operation, after identifying one or more over-erased cells and before the soft program sequence for the current sector, a weak program correction pulse is applied to the identified one or more over-erased cells, the weak program correction pulse increasing the threshold voltage of the identified one or more over-erased cells;

wherein said erase and erase verify sequence is configured to identify one or more over-erased cells in the current sector by iteratively applying an over-erase threshold voltage with incremental change until only said one or more over-erased cells pass.

2. A circuit comprising:

a nonvolatile memory array;

peripheral circuitry coupled to word lines and bit lines in the array, including an address decoder, a page buffer, and biasing arrangement supply voltage sources; and control logic coupled to the peripheral circuitry, the control logic being configured to:

respond to an erase command identifying a block of memory cells in the array, by executing an erase operation including an erase sequence applying an erase bias that reduces threshold voltages of memory cells in the block, and an erase verify sequence that determines whether the memory cells in the block have threshold voltages below a first erase verify level, and that identifies one or more memory cells in the block that have threshold voltage below a second erase verify level, lower than the first erase verify level; and respond to an erase suspend command received after the erase verify sequence identifies one or more memory cells in the block that have threshold voltage below the second erase verify level by executing an erase suspend operation suspending the erase operation, including selectively applying a weak program bias arrangement to the identified one or more memory cells, the weak program bias arrangement increasing the threshold voltage of the identified one or more memory cells, and allowing the control logic to execute another operation on the memory array;

wherein the weak program bias arrangement is applied only to the identified one or more memory cells.

* * * * *